(12) United States Patent
Ciplickas et al.

(10) Patent No.: US 7,197,726 B2
(45) Date of Patent: Mar. 27, 2007

(54) TEST STRUCTURES FOR ESTIMATING DISHING AND EROSION EFFECTS IN COPPER DAMASCENE TECHNOLOGY

(75) Inventors: Dennis J. Ciplickas, San Jose, CA (US); Markus Decker, Munich (DE); Christopher Hess, San Ramon, CA (US); Brian E. Stine, Santa Clara, CA (US); Larg H. Weiland, San Ramon, CA (US)

(73) Assignee: PDF Solutions, Inc., San Jose, CA (US)

( * ) Notice: Subject to any disclaimer, the term of this patent is extended or adjusted under 35 U.S.C. 154(b) by 189 days.

(21) Appl. No.: 10/490,908

(22) PCT Filed: Sep. 27, 2002

(86) PCT No.: PCT/US02/30904

§ 371 (c)(1),
(2), (4) Date: Jul. 16, 2004

(87) PCT Pub. No.: WO03/027690

PCT Pub. Date: Apr. 3, 2003

(65) Prior Publication Data

US 2004/0232910 A1  Nov. 25, 2004

(51) Int. Cl.
*G06F 17/50* (2006.01)
*H01L 25/48* (2006.01)
*G01R 31/26* (2006.01)

(52) U.S. Cl. .............. 716/4; 438/11; 257/48

(58) Field of Classification Search ................ 716/4–5; 438/14, 11; 324/230; 257/48
See application file for complete search history.

(56) References Cited

U.S. PATENT DOCUMENTS

| 5,737,072 | A | 4/1998 | Emery et al. |
|---|---|---|---|
| 6,252,412 | B1 * | 6/2001 | Talbot et al. ............... 324/750 |
| 6,423,640 | B1 | 7/2002 | Lee et al. |
| 6,445,199 | B1 | 9/2002 | Satya et al. |
| 6,449,749 | B1 | 9/2002 | Stine |

(Continued)

FOREIGN PATENT DOCUMENTS

WO  WO 01/35718  5/2001

(Continued)

OTHER PUBLICATIONS

Pan, J. Tony, et al. "Copper CMP integration and time dependent pattern effect", 1999, IEEE, pp. 99-164-99-166.*

(Continued)

*Primary Examiner*—Stacy A Whitmore
(74) *Attorney, Agent, or Firm*—Duane Morris LLP; Steven E. Koffs

(57) ABSTRACT

A test structure combines a first structure (1010) for erosion evaluation with a second structure (1000) for extraction of defect size distributions. The first structure (1010) is a loop structure usable determine a resistance value that varies with metal height. The second structure is a NEST structure (1000). Loop lines of the loop structure (1010) are connected on both sides of the NEST structure (1000).

22 Claims, 13 Drawing Sheets

U.S. PATENT DOCUMENTS

| | | | |
|---|---|---|---|
| 6,795,952 B1 * | 9/2004 | Stine et al. | 716/5 |
| 6,854,100 B1 * | 2/2005 | Chuang et al. | 716/5 |
| 6,901,564 B2 * | 5/2005 | Stine et al. | 716/4 |
| 2002/0166964 A1 * | 11/2002 | Talbot et al. | 250/307 |
| 2003/0145292 A1 * | 7/2003 | Stine et al. | 716/4 |
| 2005/0139767 A1 * | 6/2005 | Pinto et al. | 250/307 |

FOREIGN PATENT DOCUMENTS

| | | |
|---|---|---|
| WO | WO 03/027690 A1 | 4/2003 |

OTHER PUBLICATIONS

Stine et al., Rappid Characterization and Modeling of Pattern-Dependent Variation in Chemical-Mechanical Polishing, Feb. 1998, pp. 129-140, vol. 11, No. 1, IEEE Transactions on Semiconductor Manufacturing.

Dejule, Ruth, Dual-Damascene: Overcoming Process Issues, Sep. 28, 2001, pp. 1-7, http://www.semiconductor.net/semiconductor/issues/issues/2000/200006/ six0006dual.asp.

International Search Report for PCT/US02/30904.

* cited by examiner

300

400

TEST STRUCTURES FOR ESTIMATING DISHING AND EROSION EFFECTS IN COPPER DAMASCENE TECHNOLOGY

FIELD OF THE INVENTION

This invention relates to methods for measuring and evaluating the process and design related statistical variations of an integrated circuit manufacturing process in order to determine their sources and their effects on the yield and performance of the product.

BACKGROUND OF THE INVENTION

Dishing and Erosion effects are well known in copper (Cu) damascene semiconductor manufacturing processes (see FIGS. 1, 2A and 2B). FIG. 1 shows a structure 110 having copper 12 and oxide 11 layers prior to chemical mechanical polishing (CMP). FIG. 2A shows a structure with a Cu dishing condition 120, in which the oxide layer 121 and Cu layer 122 are reduced by respective amounts 123 and 124 below the original height 125 of the top of the oxide layer 121, so that the top of Cu layer 122 is below the top of oxide layer 121. FIG. 2B shows a configuration 130 in a "Cu up" condition, in which the oxide layer 131 and Cu layer 132 are reduced by respective amounts 133 and 134 below the original height 135 of the top of the oxide layer 131, so that the top of Cu layer 132 is above the top of oxide layer 131.

Optimizing these effects during process development can be difficult because they may have clear and opposite interactions with process recipe settings. Thus, it is desirable to have the ability to separate dishing and erosion effects for rapid process development and optimization.

Physical measurements are typically used to confirm dishing and erosion effects during Cu process development. Because these measurement methods are time consuming, it is difficult to gather enough statistics to confirm the stability of the process during process development. Electrical test structures can provide a much larger statistical sample. But because previously developed electrical test structures are essentially "gratings" with fixed line and space across the entire test structure, it can be difficult to separate dishing and erosion effects in such electrical measurements.

The following four documents are hereby incorporated by reference herein in their entireties, as though set forth herein fully: T. Tugbawa et al., "A Mathematical Model of Pattern Dependencies in Cu CMP Processes," CMP Symposium, Electrochemical Society Meeting, Honolulu, Hi., October 1999; Stine, B. et al. "A Closed-Form Analytic Model for ILD Thickness Variation in CMP Processes," 1997 Chemical Mechanical Polish for ULSI Multilevel Interconnection Conference (CMP-MIC), p. 266, Santa Clara, February, 1997; Tae Park et al., "Electrical Characterization of Copper Chemical Mechanical Polishing" CMPMIC '99, pp. 184–191, February 1999; and Tae Park et al., "OVERVIEW OF METHODS FOR CHARACTERIZATION OF PATTERN DEPENDENCIES IN COPPER CMP," Proc. CMP-MIC, pp. 196–205, Santa Clara, Calif., March 2000.

Even if Cu dishing and erosion are well understood during process development, it can be difficult to use that information to analyze the yield and performance variations resulting from Cu dishing and erosion on a particular product design.

SUMMARY OF THE INVENTION

The present invention is a test structure having a first structure for erosion evaluation and a second structure for extraction of defect size distributions and defect density distributions.

DETAILED DESCRIPTION

One method to analyze the yield and performance variations resulting from Cu dishing and erosion on a particular product design is to build a model of Cu dishing and erosion effects observed during Cu process development. This model can be applied to a given product layout to predict the dishing and erosion of any particular wire in the layout. Accurate model application requires knowledge of the "interaction distance" of pattern features. The exemplary embodiment described herein provides electrical test structures that separate dishing and erosion effects while providing statistically significant measurement samples for process development and optimization. The exemplary embodiment also provides a test structures that can provide the "interaction distance" of pattern features.

This exemplary includes, but is not limited to, three components:

The "Multi-Tap Kelvin" (MT-Kelvin) test structure. The MT-Kelvin test structure is used to test the resistance response of a kelvin strip line to drawn pattern changes in the width of that line as well as the "local" and "global" neighborhood of that line. Among its unique features, it allows multiple kelvin segments, with unique line widths and local neighborhoods, to be embedded within one "global neighborhood" with a given density. The device under test (DUT) segments can be "snaked" for increased resistance and increased resolution of resistance variations. These features are combined in this test structure to enable separation of Cu dishing and erosion effects with an appropriate Design-of-Experiments.

A Design-of-Experiments (DOE) for the above test structure that enables accurate analysis and modeling of Cu chemical mechanical polishing (CMP) dishing and erosion effects. The combination of the DOE and test structures uniquely allows separation of individual dishing and erosion effects, as well as cross-validation of their combined effects.

The "LoopNest" test structure. The LoopNest is used to extract the "interaction distance" of pattern variations on kelvin strip lines. It is unique in that it uses the electrical testable NEST test structure as the dummy pattern to establish the dense region around the kelvin strip lines. Previous test patterns use untestable dummy polygons for this purpose.

Each of these components is described in more detail below.

The Multi-Tap Kelvin Test Structure

Figure 3:
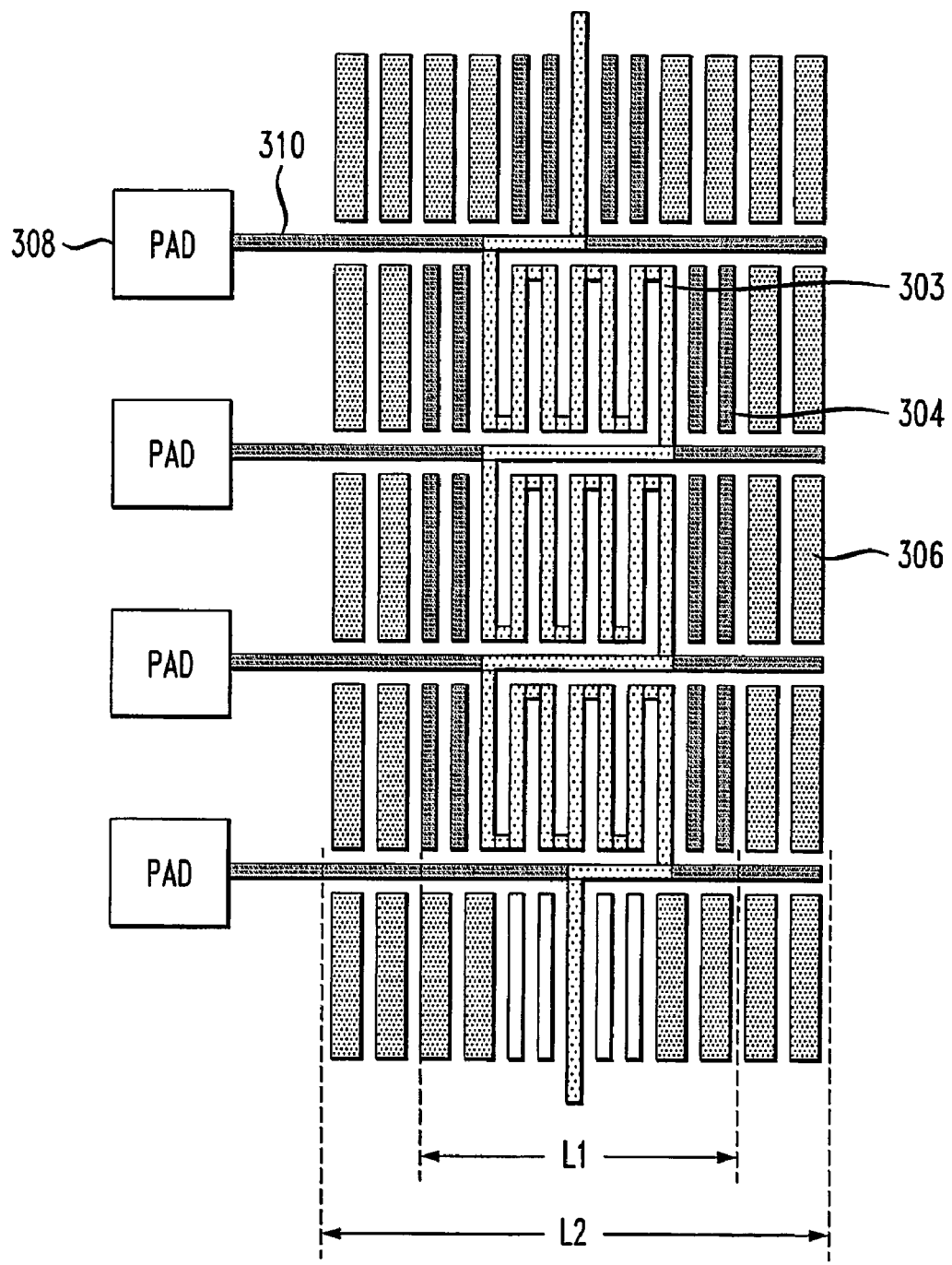
FIGS. 3 is a plan view of a multi-tap snaked Kelvin test structure.

The Multi-Tap Kelvin (MT-Kelvin) test structure is shown in FIG. 3. The structure includes the DUT 303, in which a plurality of snake segments are connected by a plurality of taps 310. The taps 310 allow one to determine in which of the three snake segments any short or open circuit that may be present is located. Each tap 310 has a pad 308 for electrical test measurements. Patterns 304 are provided as shielding lines. Patterns 306 are global neighborhood patterns. In the exemplary MT-Kelvin structure of FIG. 3, length L1 is between about 3 micrometers to about 6 micrometers, and length L2 is between about 100 micrometers and about 600 micrometers. One purpose of the test structure is to allow separation of dishing and erosion effects.

MT-Kelvin structure 303 is a single layer test structure with individually controllable line width and line space for DUT, local neighborhood 304 and global neighborhood 306:

DUT line width variations are used to stimulate dishing effects. If the DUT line width is very small, lithography or barrier metal effects may dominate the resistance response.

Local neighborhood variations are used to control the lithographic and short-range CMP effects on the DUT 303.

Global neighborhood variations are used to control long-range CMP effects on the DUT.

For dishing, one can exclude the global neighborhood patterns 306 to create an iso region. The line width of the DUT 303 can be varied to measure dishing.

For erosion, the line size (L/S) of DUT 303 is fixed small enough to avoid affecting global density but large enough to avoid litho effects. The global L/S of patterns 306 can be varied to stimulate oxide erosion.

For dishing plus erosion, the L/S of DUT 303 is fixed to be equal to the global L/S of patterns 306. This combines dishing and erosion effects in DUT measurement.

In addition to controllable line width and line space, the MT-Kelvin test structure allows multiple "snake segments" in the DUT line. A "snaked DUT" is used to increase the resistance of the DUT line for increased resolution of small changes in that resistance due to layout neighborhood or processing effects. Although the exemplary DUT 303 has three snake segments, any number of snake segments may be included. Further, the number of turns within each snake segment may be varied.

The exemplary test structure was designed to be used with a DOE to separate Cu dishing from Cu/Oxide erosion effects in the DUT.

One feature of the MT-Kelvin is that the oxide thickness around the DUT 303 and local neighborhood 304 will match the oxide thickness of the global neighborhood 306. In this manner, variation if the global neighborhood pattern 306 can be used to stimulate erosion effects and drive basic Cu thickness variation of the DUT 303, while DUT line width can be used to stimulate dishing effects and drive further Cu thickness variation of the DUT.

Figure 4A:
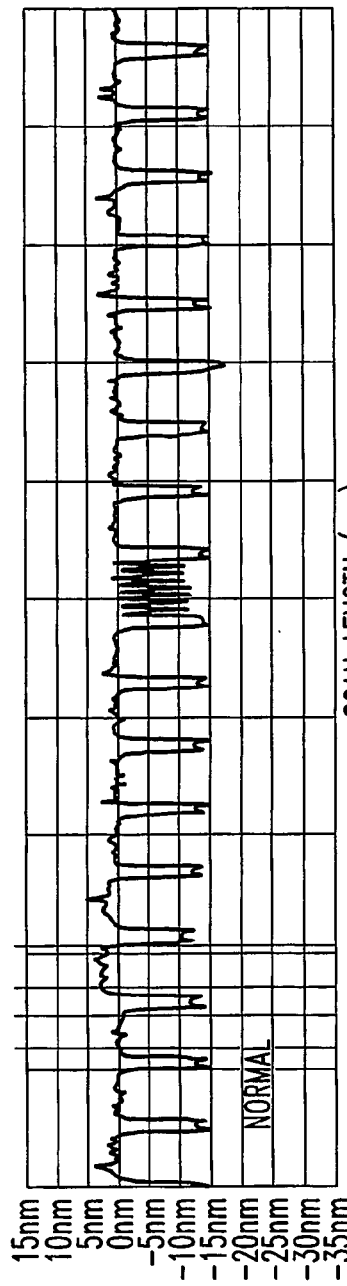
FIGS. 4A–4C are graphs showing oxide height versus scan length for narrow line/wide space, medium line/medium space, and narrow line/narrow space, respectively.
Figure 4B:
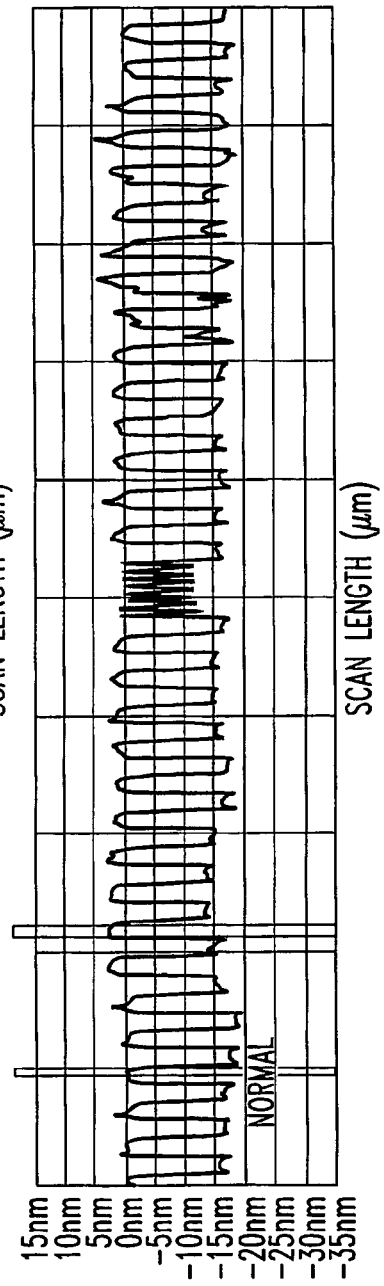
Figure 4C:
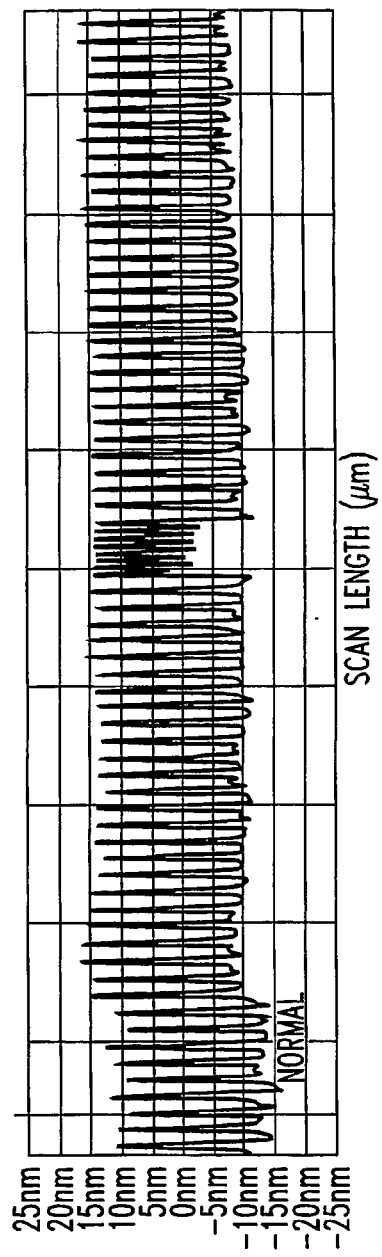

The MT-Kelvin structure 300 has been fabricated in multiple semiconductor manufacturing processes using Cu wiring. Profilometry results from a representative Cu process confirming the local vs. global behavior of the MT-Kelvin is shown in FIGS. 4A–4C. FIGS. 4A–4C show three curves, each having respectively different line width and/or line space for the global neighborhood lines. These three curves include: FIG. 4A: narrow line/wide space; FIG. 4B: medium line/medium space; and FIG. 4C: narrow line/narrow space. The oxide height in the DUT region 303 accurately tracks oxide height in global neighborhood region 306 across a wide variation of global density.

The Cu CMP Modeling DOE

A Design-of-Experiments (DOE) can be used with the MT-Kelvin test structure 300 to separate Cu dishing effects from Cu/Oxide erosion effects. This DOE is shown in Tables 1–3. Three separate experiments are used to check:

Global erosion effects

Local dishing effects

Interaction terms between dishing and erosion

In Table 1, the DUT 303 has a fixed line size (L/S) of 0.5 micrometers/0.5. micrometers. The DOE is in the L/S of global region 306. The exemplary DUT measures oxide erosion induced by L/S variation within global region 306.

TABLE 1

| | Density (%) | | | | | | | |
|---|---|---|---|---|---|---|---|---|
| LW | 25 | 50 | 65 | 75 | 80 | 85 | 90 | 95 |
| 70.00 | x | x | x | x | x | x | x | x |
| 50.00 | x | x | x | x | x | x | x | x |
| 35.00 | x | x | x | x | x | x | x | x |
| 20.00 | x | x | x | x | x | x | x | x |
| 10.00 | x | x | x | x | x | x | x | x |
| 5.00 | x | x | x | x | x | x | x | |
| 2.00 | x | x | x | x | x | | | |
| 1.00 | x | x | x | x | | | | |
| 0.50 | x | x | x | | | | | |
| 0.30 | x | x | | | | | | |
| 0.20 | x | x | | | | | | |
| 0.16 | x | x | | | | | | |

In Table 2, the DUTs are isolated lines of varying width. The exemplary DUT 303 measures dishing versus line width.

TABLE 2

| | |
|---|---|
| LW | 70.00 |
| | 50.00 |
| | 35.00 |
| | 20.00 |
| | 10.00 |
| | 5.00 |
| | 2.00 |
| | 1.00 |
| | 0.50 |
| | 0.30 |
| | 0.20 |
| | 0.16 |

In Table 3, the structure is a perfect grating with DUT L/S equal to the L/S of global neighborhood 306. These data are used to validate the CMP model extracted from dishing/erosion experiments.

TABLE 3

| | | Density (%) | | |
|---|---|---|---|---|
| | | 50 | 80 | 95 |
| LW | 70.00 | x | x | x |
| | 50.00 | x | | |
| | 35.00 | x | x | x |
| | 20.00 | x | | |
| | 10.00 | x | x | x |
| | 5.00 | x | x | x |
| | 2.00 | x | | |
| | 1.00 | x | | |
| | 0.50 | x | | |
| | 0.30 | x | | |
| | 0.20 | x | | |
| | 0.16 | x | | |

Figure 5B:
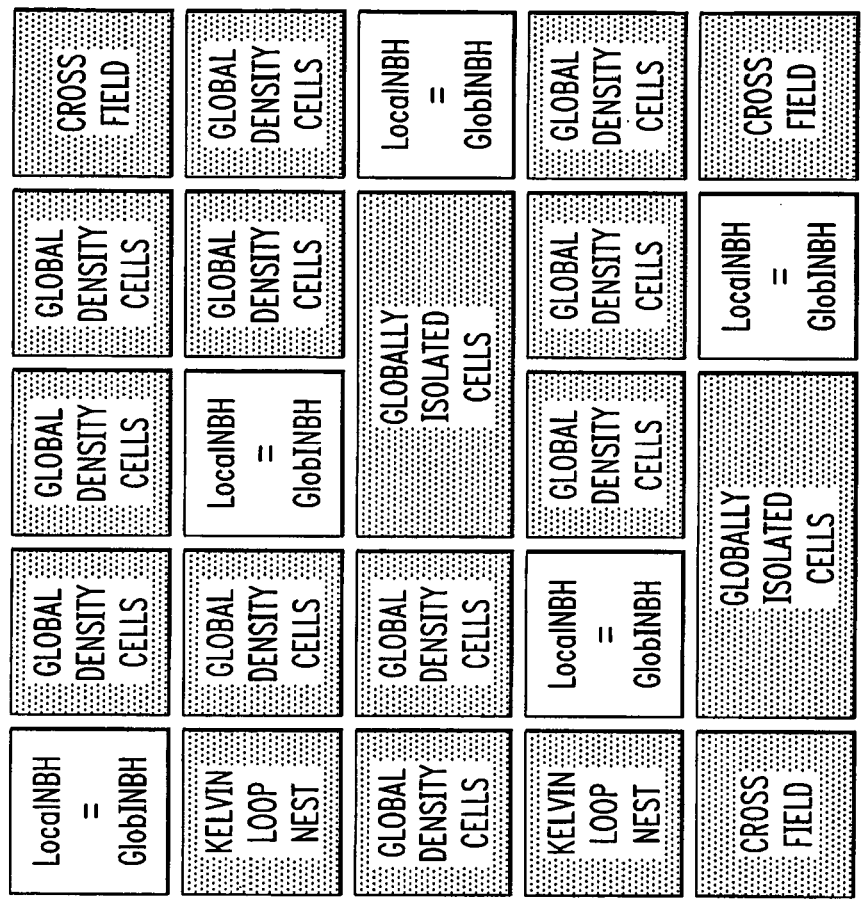
FIG. 5B shows the details of one of the quadrants of FIG. 5A, including the test conditions for each region.
Figure 5A:
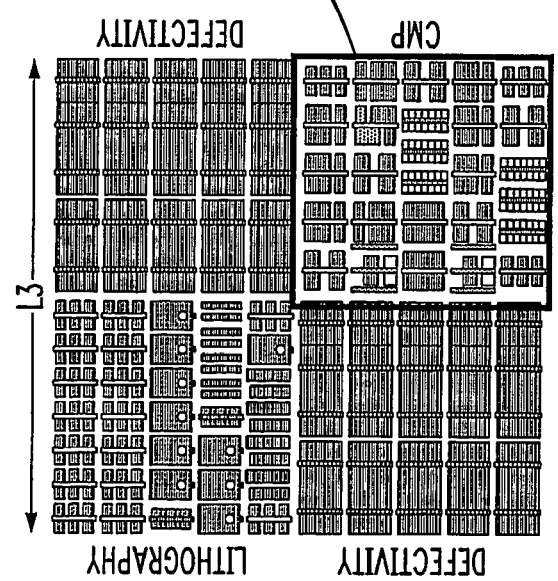
FIG. 5A shows a floorplan of a test structure according to the invention.

An exemplary reticle floorplan for the above experiments is shown in FIGS. 5A and 5B. The exemplary reticle floorplan has a dimension L3 of about 22 millimeters, but other reticle sizes may be used. The floorplan is designed to minimize global effects (e.g. long range bulk Cu polish effects). In FIG. 5B, the term "LocalNBH" refers to local neighborhood, and the term "GloblNBH" refers to the global neighborhood.

The Erosion Experiment

In the erosion experiment, a fixed DUT 303 and local neighborhood 304 are used to monitor erosion effects due to pattern variations in global neighborhood 306.

In one example, the DUT 303 and local neighborhood 304 have a fixed line width and line space for all experimental variants. Fixing these dimensions ensures that the dishing in the DUT 303 and any lithographic printing variations in the DUT trench, remain constant. This allows the erosion response to be observed separately from the dishing response.

The line width and line space of DUT 303 and local neighborhood 304 should be chosen large enough to avoid excessive lithography variation but not so large that any significant Cu dishing will occur. Experience has shown that a line width and line space of 0.5 μm are adequate for this purpose.

The line width and line space of global neighborhood 306 are varied to simulate erosion effects during CMP polish. Both the pattern density and the oxide line width of a region can simulate erosion effects. This is described in T. Tugbawa, T. Park, D. Boning, L. Camilletti, M. Brongo, and P. Lefevre, "Modeling of Pattern Dependencies in Multi-Step Copper Chemical Mechanical Polishing Processes," Chemical Mechanical Polish for ULSI Multilevel Interconnection Conference (CMP-MIC 2001), pp. 65–68, Santa Clara, March 2001, which is incorporated by reference herein. Thus, a DOE in line width and density of global region 306 is used to span the range of such density and line width variations that may occur in a typical product. The minimum line width and line space is a function of each technology, but line widths and line spaces above this value may be held constant across technology generations.

Figure 6:
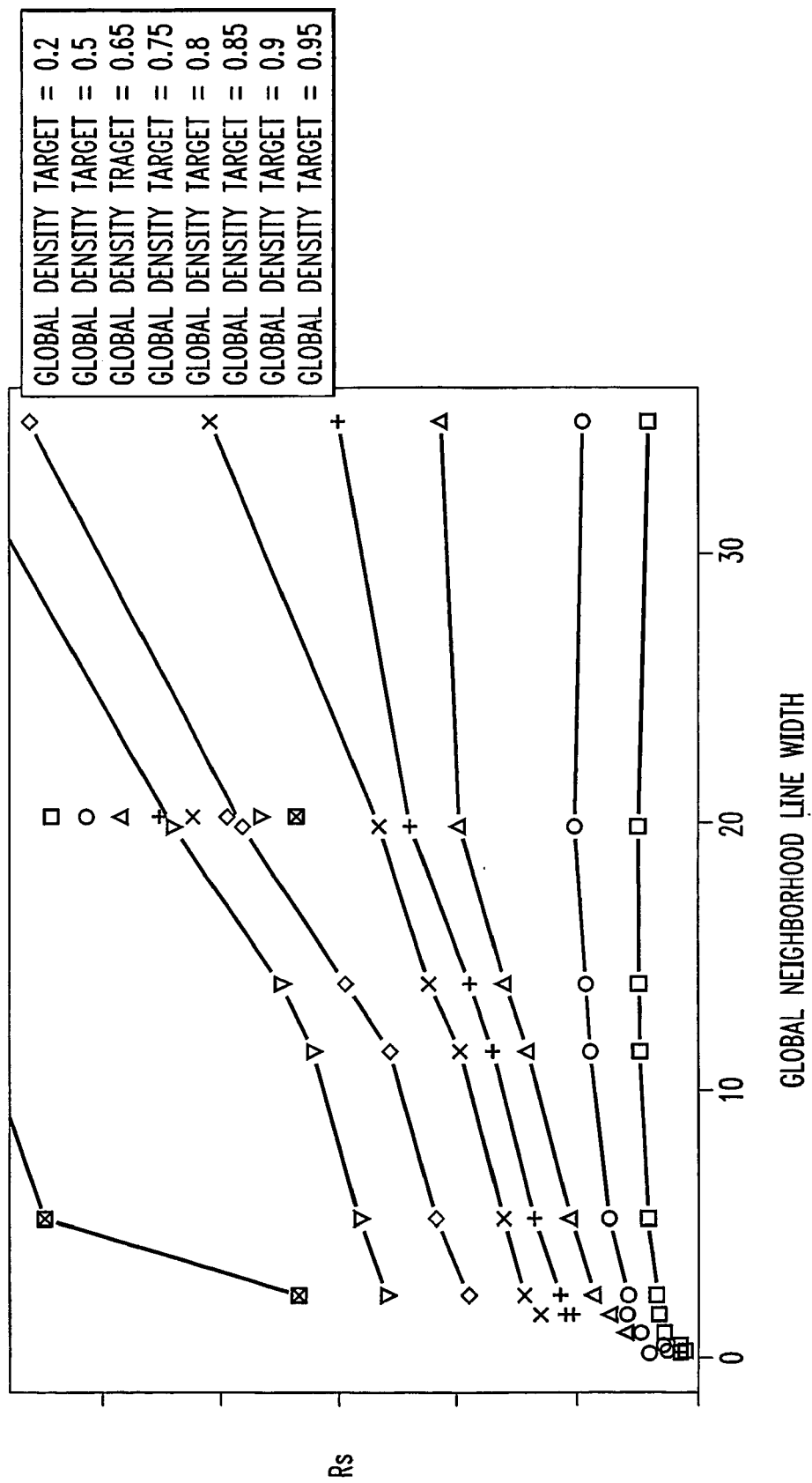
FIG. 6 is a graph showing results from an erosion experiment.

Typical resistance responses from the erosion experiment are shown in FIG. 6. In FIG. 6, increasing slope of the resistance versus line width for increasing density indicates Kox (Kox=blanket wafer polish rate) may be dependent on oxide space width.

The Dishing Experiment

In the dishing experiment, an empty global neighborhood 306 (0% density), an empty local neighborhood 304, and varying line width in DUT 303 are used to monitor dishing effects in the DUT. Alternatively, any constant global neighborhood can be used. But an empty neighborhood ensures that there is as little confounding as possible of erosion effects in this experiment, and is thus preferred for this experiment.

Line width variations in the DUT 303 cause different amounts of dishing in the DUT. Since the global neighborhood 306 is held at a constant density, the erosion variation and its effects on the DUT 303 are minimized (i.e. reduced to only the tiny effects from the pattern density of the DUT itself.) This allows the dishing response to be observed separately from the erosion response.

Figure 7:
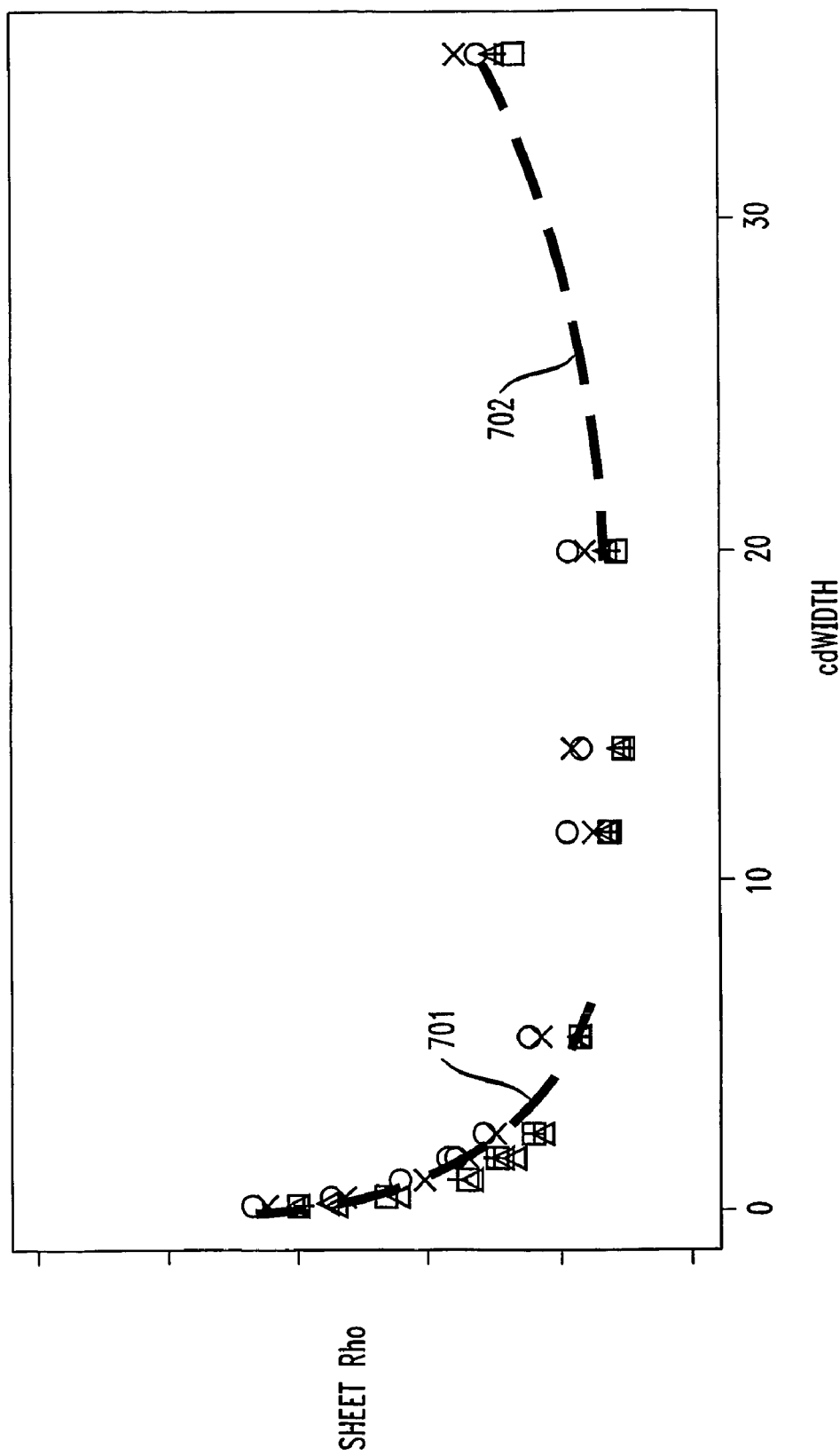
FIG. 7: Experimental Results from a dishing experiment.

Typical resistance responses from the MT-Kelvin dishing erosion experiment are shown in FIG. 7. In FIG. 7, small critical dimension width is correlated with barrier, litho and etch effects 701, and large critical dimension width is correlated with dishing.

The Dishing+Erosion Interaction Experiment

In this experiment, the DUT 303, local neighborhood 304, and global neighborhood 306 are all drawn with the same line width and line space. This confounds the effects of dishing and erosion in the DUT 303 and allows cross-validation of any Cu CMP thickness model built using the Erosion and Dishing experiments.

These structures also look very similar to the typical "grating" structures traditionally used by process engineers to optimize Cu processes. Thus they also serve the purpose of benchmarking the MT-Kelvin responses against traditional measures.

The LoopNest Test Structure

Figure 8:
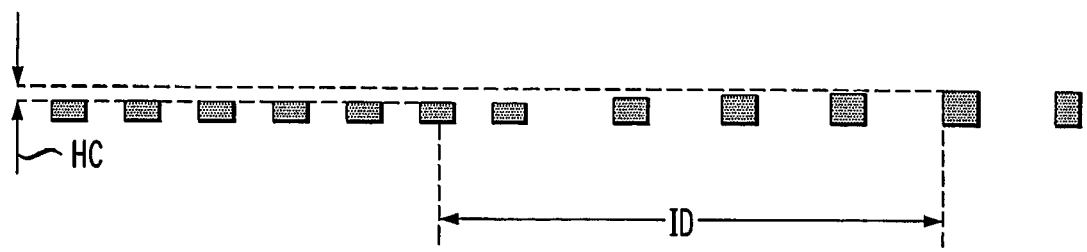
FIG. 8 shows the definition of interaction distance.

As previously described, erosion depends on metal density. Assuming there is a boundary between two different metal densities, the metal and oxide height will change on both sides of this boundary, by a height change (HC). At some point far enough away from the boundary the height will stop changing. The distance between the areas where the height is constant is defined as interaction distance (ID). It is the distance where the metal and oxide height varies, as can be seen in FIG. 8. To the left of the ID segment in FIG. 8, the height is a relatively smaller constant value. To the right of the ID segment in FIG. 8, the height is a relatively larger constant value. The interaction distance ID is the main input value to model erosion. So, it is important to provide a test structure that allows the determination of the interaction distance ID.

The interaction distance ID typically is in the multiple 100 µm range, which requires a huge chip area for a full interaction distance evaluation. For that purpose one can place loops within huge dummy fill areas that have no further purpose than to simulate the different metal densities. From the differences measured in the resistance of the loops they will conclude to the erosion of the metal lines. Placing many loops within the dummy fill area will further provide the interaction distance ID. However, test chip area is very costly, and in a constant effort to minimize test chip area, allocating a large area for dummy fill may not be commercially viable for efficient process development and process characterization.

One aspect of the exemplary embodiment is use of a test structure that combines erosion evaluation with the extraction of defect size distributions and defect density distributions that require large chip areas as well. A NEST structure is described in Hess, C., Stashower, D., Stine, B. E., Verma, G., Weiland, L. H., Miyamoto, K., Inoue, K. Fast Extraction of Killer Defect Density and Size Distribution Using a Single Layer Short Flow NEST Structure Proc. International Conference on Microelectronic Test Structures (ICMTS), p. 57–62, Monterey (USA), 2000, U.S. Provisional Patent Application 60/275,190, filed Mar. 12, 2001, and International Patent Application No. PCT/US02/07409, filed Mar. 12, 2002, all of which are incorporated by reference herein in their entireties. The basic PD NEST Structure is first described, and then the loop structure is described further below.

PD NEST Structure Design

Figures 1, 2A, 2B:
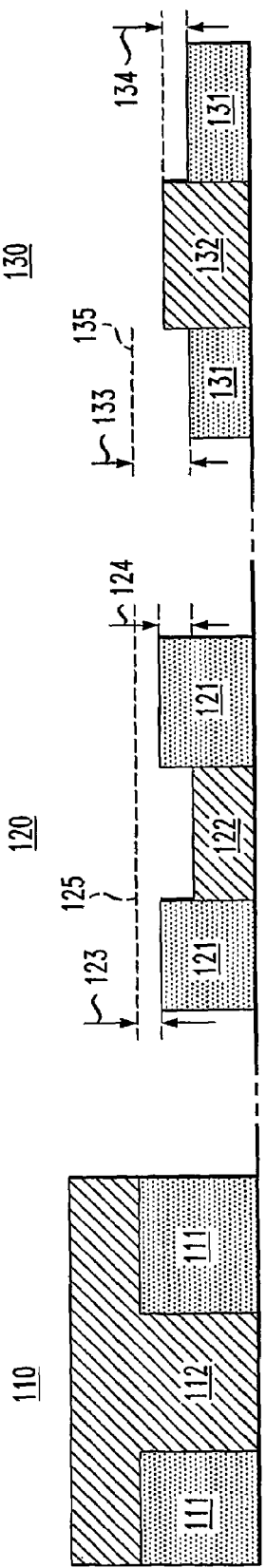
FIG. 1 shows a structure having copper and oxide layers prior to chemical mechanical polishing
FIGS. 2A and 2B are cross sectional diagrams showing Cu dishing and erosion effects after polishing the structure of FIG. 1.
Figure 10A:
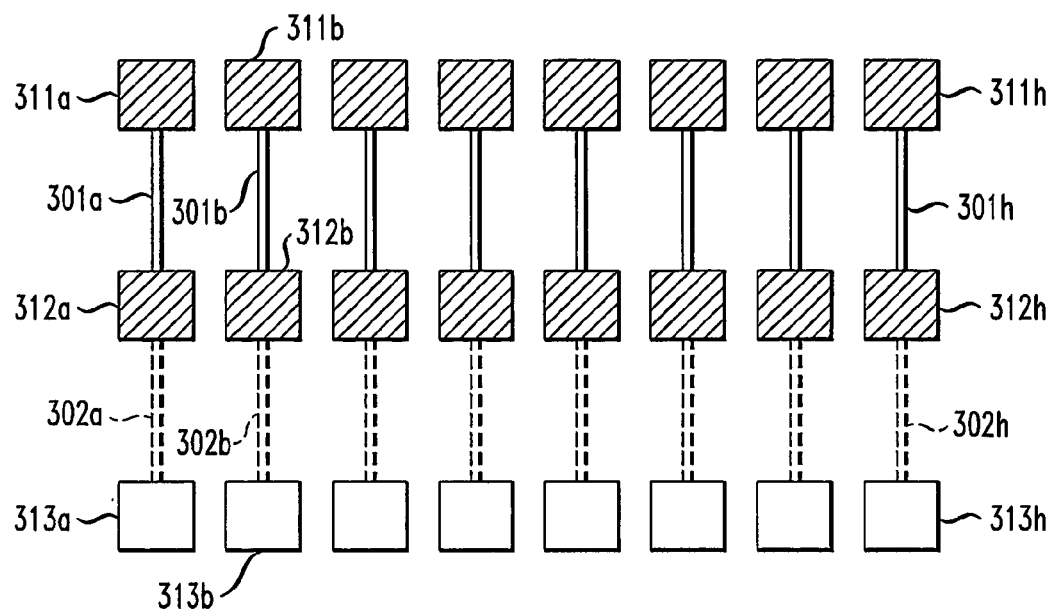
FIG. 10A shows an exemplary placement of lines sharing pads in the center.

To further improve the NEST structure some sharing of pads can be incorporated, as shown in FIG. 10A. FIG. 10A is a conceptual diagram in which the nested lines of the NEST structure are represented by straight lines, for easier visualization. It is understood that each line 301a–301h and 302a–302h represents a respective nested serpentine line. As shown in FIG. 10A, two lines may be connected to three pads (instead of four in the regular NEST structure of FIG. 1), sharing a center pad between them. For example, line 301a is connected to top pad 311a and center pad 312a, and line 302a is connected to bottom pad 313a and the same center pad 312a. For each respective pair of lines including a top line 301a–301h and bottom line 302a–302h, there is a respective top pad 311a–311h, a center pad 312a–312h and a bottom pad 313a–313h. So, for a given number M of pads in a 2-by-N pad frame, 2*integer(M/3) lines can be implemented in a PD NEST structure instead of just N lines in a regular NEST structure. For example, as shown in FIG. 10A, 16 lines can be implemented in a PD NEST. As another example (not shown), in a 2-by-15 pad frame, 20 lines may be implemented in a PD NEST structure, instead of just 15 lines in a regular NEST structure. In other words, 25% fewer pads are needed to hook up the same number of lines, which results in less test time due to less pad frame stepping time as well as significantly better usage of given chip area.

If a defect results in an open line, it can be clearly detected, either between a pad on the top and a center pad, or between a pad on the bottom and a center pad. However, for the configuration of FIG. 10A, a defect in one or more of lines 301a–301h that causes a short circuit on the top side is also measurable on the bottom side. To even separate those defects, the neighborhood relationship of the lines on the first (e.g., left) side and the second (e.g., right) side are changed using the Permutation Procedure described at Hess, C., Weiland, L. H., "Harp Test Structure to Electrically Determine Size Distributions of Killer Defects," IEEE Transactions on Semiconductor Manufacturing, pp. 194–203, Vol. 11, No. 2, 1998, which is incorporated by reference herein, and described in pertinent part below. Because there are only two sets of lines (top and bottom in FIG. 10A, or right and left in other configurations), only two rows of the 2D-matrix are calculated by the Permutation Procedure.

Parallel lines—each connected to an isolated pad—are implemented inside a test structure to electrically determine a defect size distribution. If a defect occurs and causes an electrically measurable fault, two or more test structure lines are shorted. The more test structure lines are shorted together, the larger the defect is. But, if more than two serpentine lines are connected, it is difficult to say whether there is just one large defect or some small defects have caused a multiple fault. Short circuits will connect test structure lines if, and only if, the lines are placed as neighbors anywhere inside the test chip area. So, the more different neighbored test structure lines are implemented the more short circuits are distinguishable.

The permutation procedure increases the number of differently neighbored test structure lines without increasing the number of pads. An undesigned short circuit defect is detectable between test structure lines connected to electrically distinguishable pads. For that, it is not necessary to give each test structure line an individual pad, but each pair of parallel test structure lines are connected to a unique set of pads. For this reason, all possible neighborhood relationships of adjacent lines are arranged inside a test chip no more than once.

Let a[2,j] be the index of the $j^{th}$ line in bottom (second) set of lines. Assuming that the first sequence of line numbers is simply the set of positive integers (1, 2, 3, . . . ), the number m of used index values is an even integer $$\left(\frac{m}{2} \in N\right),$$

and j is the position of the index within the second sequence, the second sequence is given by:

$$a[2, j] = \begin{cases} j+2 & \text{if } j \text{ is even and } \frac{m-j+2}{2} \geq 2 \\ 2*m-j-1 & \text{if } j \text{ is even and } \frac{m-j+2}{2} < 2 \\ 3-j & \text{if } j \text{ is odd and } \frac{j+1}{2} < 2 \\ j-2 & \text{if } j \text{ is odd and } \frac{j+1}{2} \geq 2 \end{cases}$$

Figure 10B:
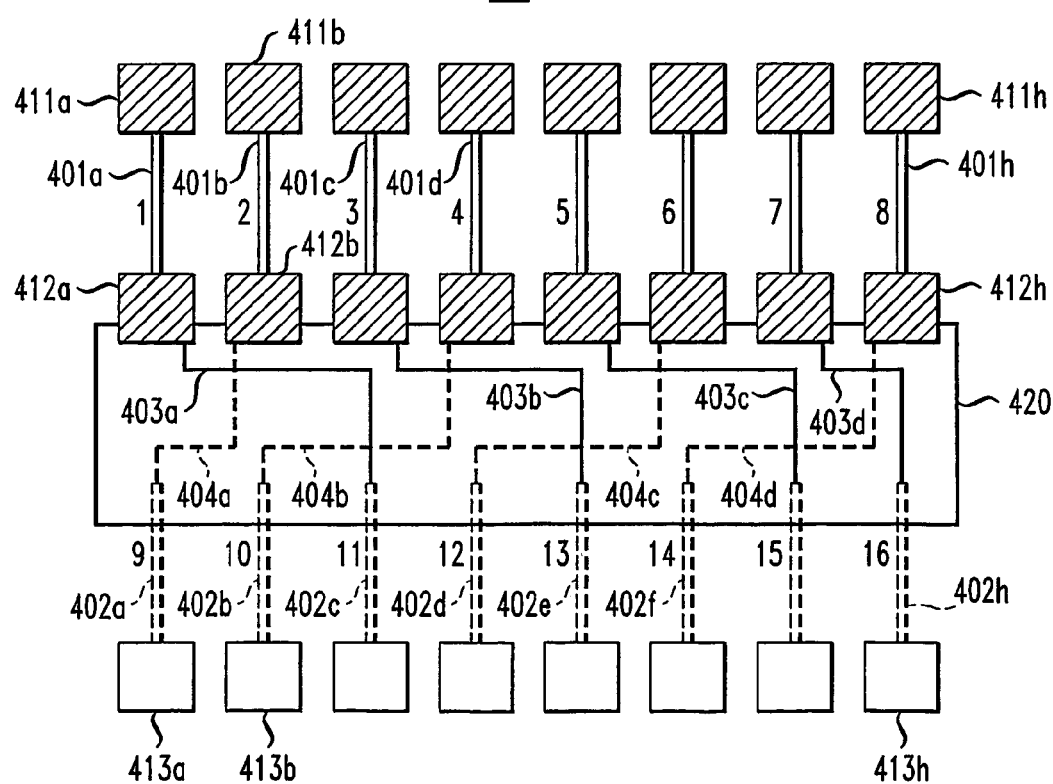
FIG. 10B is a diagram showing the bottom lines routed according to an exemplary permutation procedure.

Thus, as shown in FIG. 10B, the second sequence from the above equation is 2-4-1-6-3-8-5-7. Thus, if the top sequence of lines is 1-2-3-4-5-6-7-8, the bottom sequence of lines is 2-4-1-6-3-8-5-7. In the bottom row, the first line has the index "2", indicating that the first bottom line shares a pad with (and is electrically connected to) the second line in the top set of lines. In the bottom row, the second line has the index "4", indicating that the line shares a pad with the fourth line in the top set of lines. In the bottom row, the third line has the index "1", indicating that the line shares a pad with the first line in the top set of lines. In the bottom row, the fourth through eighth lines have the indices "6," "3," "8," "5," and "7", respectively, indicating that the lines share respective pads with the $6^{th}$, $3^{rd}$, $8^{th}$, $5^{th}$ and $7^{th}$ lines, respectively, in the top set of lines.

One of ordinary skill can readily determine the second sequence of lines by applying the above equations, for any even integer m (number of bottom lines). Using this sequence, each bottom line with index a[2,j] has one or two neighboring lines with indices a[2,j−1] and/or a[2,j+1]. The corresponding top line a[1,j], which shares a pad with line a[2,j] has one or two neighboring lines with indices a[1,j−1] and/or a[1,j+1]. The following inequalities hold for every value of j:

a[2,j−1]≠a[1,j−1]
a[2,j−1]≠a[1,j+1]
a[2,j+1]≠a[1,j−1]
a[2,j+1]≠a[1,j+1]

In other words, for each pair of top and bottom (or first and second, or right and left) lines having the index j, the adjacent neighboring lines are disjoint. Each relationship between neighboring line indices appears at most one time. This makes it possible to uniquely identify whether a short circuit between line j and one of its neighbors affects the top line a[1,j] or the bottom line a[2,j].

FIG. 10B shows an example for 2*8 lines. As in FIG. 10A, there are top pads 411a–411h, center pads 412a–412h and bottom pads 413a–413h, with top lines 401a–401h and bottom lines 402a–402h. The example of FIG. 10B adds a routing channel 420 with connecting lines 403a–403d and 404a–404d. Beside each line 401a–401h and 402a–402h, the "Permutation index" can be seen. In the example, the bottom lines 402a–402h are rearranged so that each line has a Permutation index next to it that is different from its ordinal position in the sequence of bottom lines. (i.e., the first line 402a does not have the permutation index "1," the second line 402b does not have the permutation index "2," etc.) Also, the arrangement of the permutation indices is such that no bottom line 402a–402h is adjacent to a line having the closest greater or lesser permutation index. For instance, the top line 401c (permutation index "3") is adjacent to the top line 401b (permutation index "2") and top line 401d (permutation index "4"), but the bottom line 402e (permutation index "3") is adjacent to the bottom line 402d (permutation index "6") and bottom line 402f (permutation index "8"). The different neighborhood relationships provide easy separation of defects that result in shorts in the top lines 401a–401h and bottom lines 402a–402h.

To change the order of indices, a routing channel 420 can be provided, as seen in FIG. 10B. The routing channel 420 as drawn in FIG. 10B includes crossings 403a–403d and 404a–404d that are not available on a single mask. The inventors have determined that the complete routing can be implemented without crossings, if broken apart into two groups—the set of all solid routing lines 403a–403d shown in FIG. 10B and the set of dashed routing lines 404a–404d.

Figure 11:
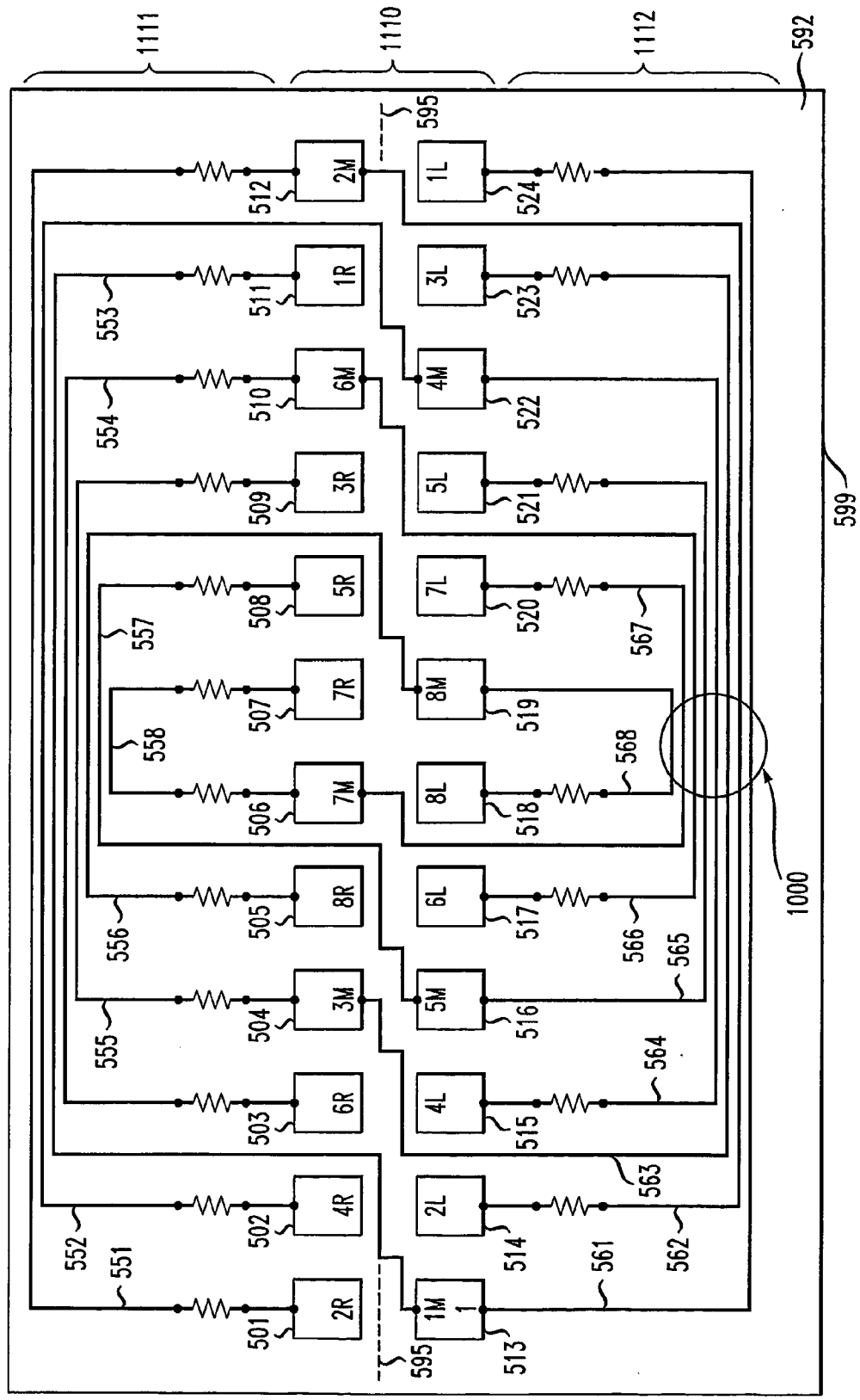
FIG. 11 shows the PD NEST.

FIG. 11 is a diagram of a test vehicle 500 comprising a substrate 599 having at least one layer, and a plurality of pairs of nested serpentine lines 501–524 on a single surface of a single layer of the substrate, each pair of nested serpentine lines having a shared pad 1M–8M therebetween.

FIG. 11 is an exemplary routing of the set of lines in FIG. 10B, wherein the nested serpentine lines are drawn. In FIG. 11, the bottom set of lines are sequentially numbered "1" through "8", and the top set of lines are numbered by the sequence 2-4-1-6-3-8-5-7. Thus, in FIG. 11, the top set of lines is the second set and bottom set of lines is the first set. This is the opposite of FIG. 10B, in which the top set is the first set and the bottom set is the second set.

The test vehicle 500 comprises a substrate 599 having at least one layer with a first (top) side 519 above line 595 and a second (bottom) side 592 below line 595. A first row of pads 501–512 is on the first side 591 of the substrate 599. A second row of pads 513–524 is on the second side 592 of the substrate 599. A plurality of pairs of nested serpentine lines (551 and 562, 552 and 564, 553 and 561, 554 and 566, 555 and 563, 556 and 568, 557 and 565, 558 and 567) are on the substrate. The pairs of pads are designated 1L and 1R, 2L and 2R, . . . , 8L and 8R. The designations L and R signify "left" and "right," but these designations are arbitrary, and do not require a particular orientation of the patterns or of the test vehicle 500. L could alternatively correspond to "right," "bottom" or "top" and R could correspond to "left," "top" or "bottom," so long as L and R correspond to two different sides.

Each pair of nested serpentine lines has a shared pad 1M–8M (items 513, 512, 504, 522, 516, 510, 506 and 519, respectively) therebetween. Each pair (e.g., 551 and 562) of nested serpentine lines 501–524 includes a first line (e.g., 551) and a second line (e.g., 562), such that: the first line (e.g., 551) extends beyond the first row of pads 501–512 on the first side 591 of the substrate 599, and the second line (e.g., 562) extends beyond the second row of pads 513–524 on the second side 592 of the substrate 599.

FIG. 11 is an example of one such routing. In FIG. 11, the three sets of pads (top, center and bottom) of FIG. 10B are rearranged to fit in two rows of pads. One routing set is placed in one half of a 2-by-N pad frame (e.g. top row of pads 501–512 drawn 2-by-N in FIG. 11), while the other routing set is placed in the other part of a 2-by-N pad frame (e.g., the bottom row of pads 513–524 horizontally drawn 2-by-N in FIG. 11). The top row of pads 501–512 includes "right" pads designated 1R to 8R, and "middle" pads designated 2M, 3M, 6M and 7M. The bottom row of pads 513–524 includes "left" pads designated 1L to 8L, and "middle" pads designated 1M, 4M, 5M and 8M. Note that the designations top, bottom, left and right refer only to the positions in the drawings. Configurations can be readily implemented in which top and bottom positions are substituted for right and left, or vice-versa.

In FIG. 11, the permutation indices 1R–8R, 1M–8M and 1L–8L indicate which pads are connected to each other. Pads having the same number in their respective indices are connected. No pad is positioned directly opposite a pad to which it is connected. For example, pad 512 (permutation index 2M) is connected to pad 501 (permutation index 2R) and pad 514 (permutation index 2L).

Using this routing scheme leads to an exemplary embodiment of the PD NEST structure as an example for 2*8 lines can be seen in FIG. 11. Now, the indices of the lines that are shorted together indicates whether the defect can be found in the upper or lower section of the PD NEST structure. For example, if only lines connected to pads having the permutation indices 2 and 4 are shorted together, then the short circuit must be on the top half of the configuration, between the lines 551 and 552 connected to pads 501 and 502, respectively. If, however, only lines connected to pads having the permutation indices 2, 3 and 4 are all shorted together, then the short circuit must be on the bottom half of the configuration, among lines 562, 563 and 564.

Although the preferred embodiment of FIG. 11 includes nested serpentine lines, one of ordinary skill could implement other test structures using the techniques described herein. For example, comb structures or any other test structures capable of measuring shorts, or combinations thereof (e.g., comb and nest), may be implemented instead of nested serpentine lines.

It is also understood that placing the lines 551–558, 561–568 and pads 501–524 on a single surface of a single layer of the test vehicle 599 does not prevent the test vehicle from having other layers. Thus, the configuration shown in FIG. 11 (or another configuration of pads and nested serpentine lines can be included on one surface of a test vehicle having additional layers.

To design a NEST structure there are three main design guidelines:

To prevent the problem of separating multiple defects within a NEST structure, the area per NEST structure should be limited such that on average no more than one defect is expected within two NEST structures.

To keep the NEST structure measurable, the resistance value per line should be within the limits given by the testing equipment.

Finally, testing time should be within a given limit per wafer, which gives the maximum number of pad frames and NEST structures that may be implemented within a die.

Given today's low expected defect densities, testing time usually is the main limitation for analog DC measurements using a parametric tester. For digital testing as described at Hess, C., Weiland, L. H., "A Digital Tester Based Measurement Methodology for Process Control in Multilevel Metallization Systems", Proc. 1995 SPIE's Microelectronic Manufacturing, Vol. 2637, pp. 125–136, 1995, the line resistance usually is the main consideration for the NEST structure design.

LoopNEST Structure

Figure 9:
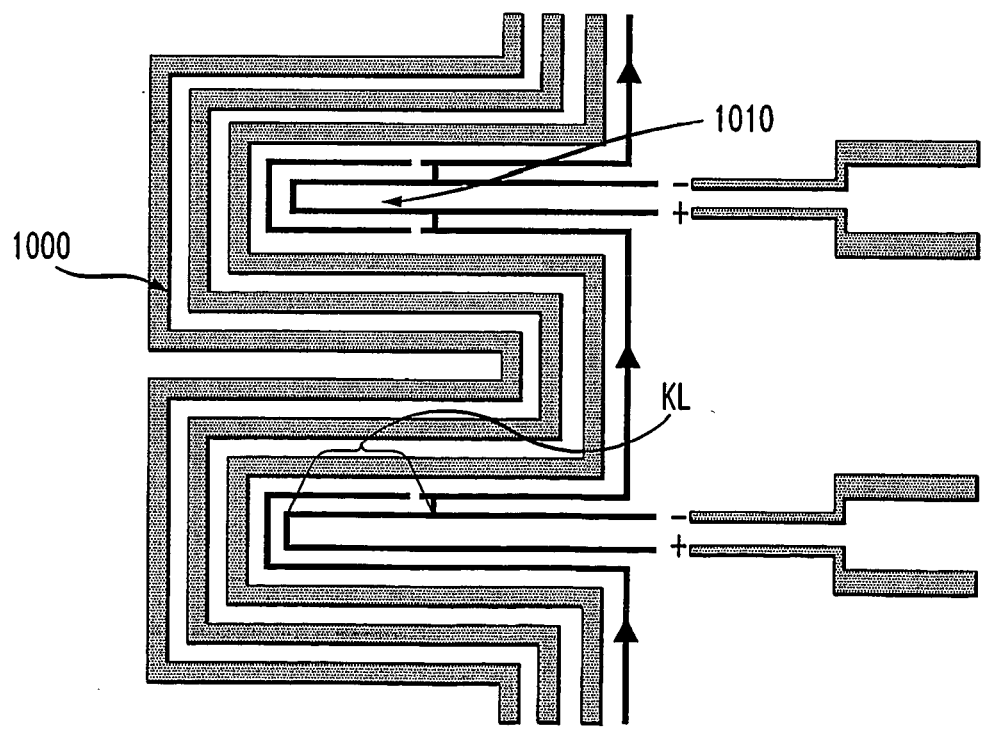
FIG. 9 is a diagram of the principle design of a single layer NEST structure with loops inserted therein.

The NEST structure described with reference to FIGS. 10B and 11 provides a very efficient method for defect detection. This structure may be expanded to include loop structures to determine a resistance value that varies with the metal height. FIG. 9 shows a NEST structure 1000 with loops 1010 included in the turns of the serpentine NEST lines. This test structure is referred to hereinafter as the "LoopNEST" test structure. To determine the interaction distance ID, many loops 1010 are implemented at different locations within the LoopNEST structure 1000. A list contains indices into the array which correspond to the location of a particular turn in the nest with 0 being a particular reference point at the bottom of the nest 1000. The loops 1010 are placed either inside or outside the NEST 1000. To know where a loop has been placed a number is assigned to every loop, indicating the location of the loop. "0" is defined as either the top or the bottom edge of the NEST structure 1000. Negative numbers mean that a loop is placed outside the NEST and extends into the surrounding area. Positive numbers represent the distance (in turns) to a particular Kelvin loop 1010. The number of loops 1010 is dependent on the size of the padframe used to hook them up for testing purposes. The "routing channel width" is defined as the distance from the outside edge of the LoopNEST to the padframe, where the loops will be connected. The "Kelvin length" (KL) is defined as the distance from the voltage tap to the U-turn of the loop.

To manage an efficient connection of the serpentine lines of the LoopNEST as well as the loops 1010, the exemplary serpentine NEST lines are connected according to the PD NEST arrangement (PDNEST is short for PermuteD NEST) as shown in FIG. 11, and described above. Where the schematic lines are shown in FIG. 11, the padframe is designated collectively as item 1110. The nest lines shown schematically in FIG. 11 on the top side of the padframe 1110 are collectively designated 1111 and the lines shown on the bottom side of the padframe 1110 are collectively designated 1112. The nested snake sections 1000 (shown in FIG. 9) are incorporated in the region shown schematically as item 1000 in FIG. 11. In an actual layout, the snake sections 1000 occupy most of the length (e.g., approximately 98%) of the nest, so that on the order of 100 snake turns may be included in the region designated 1000 in FIG. 11. The loop lines 1020 may be placed in any of these turns.

Figure 12:
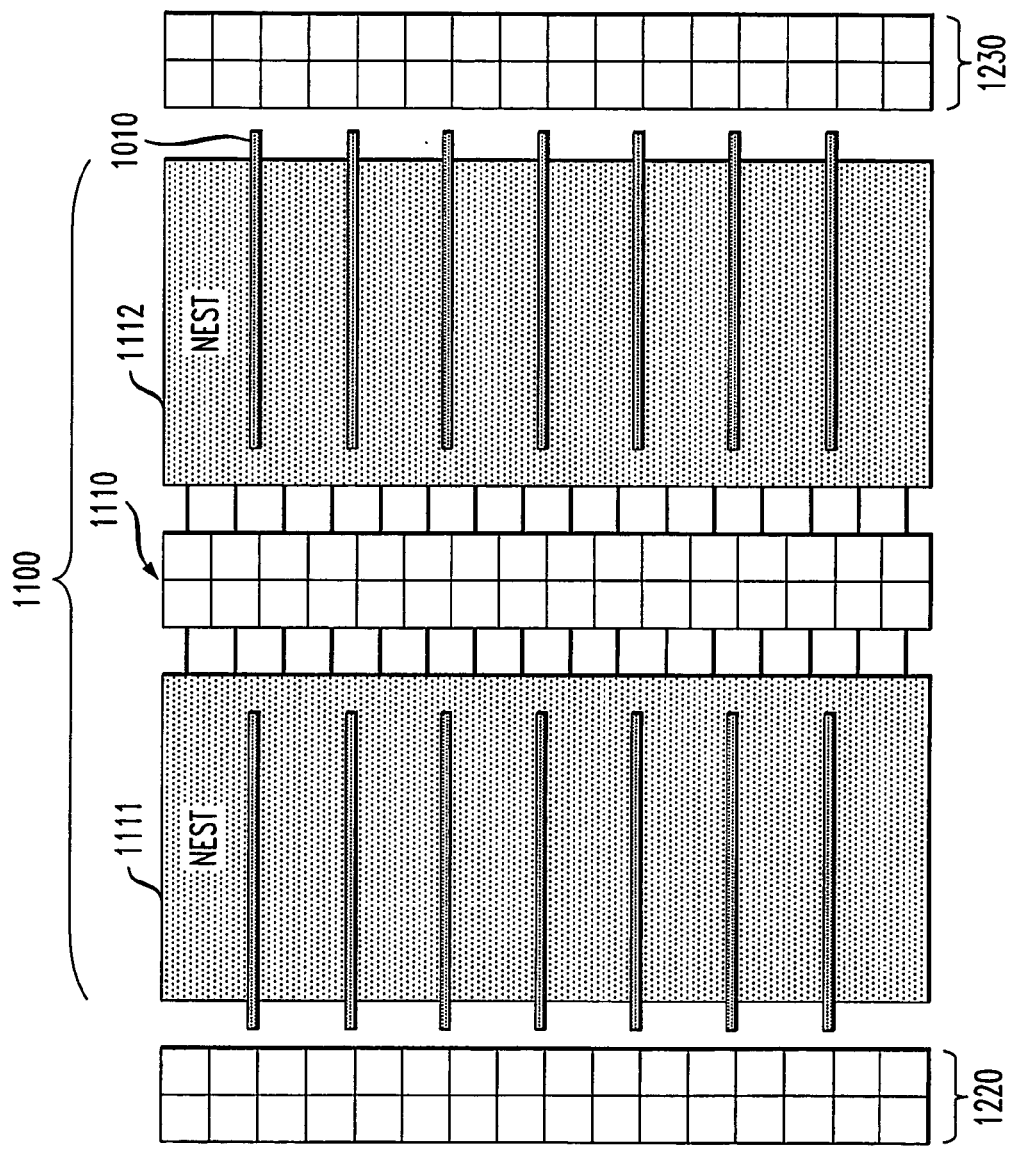
FIG. 12 shows the addition of pad frames to the left and right side of the LoopNEST to connect the loops for 4 point Kelvin type measurements. The arrangement of loops shown explores the interaction distance inside a certain metal density area.

FIG. 12 shows how the loop lines 1010 can be connected on either side of the serpentine NEST lines 111 and 1112. By doing so, the inclusion of the loops 1010 incurs no significant area penalty compared to the regular PD NEST structure. In FIG. 12, pad frames 1220 and 1230 are added to the respective left and right sides of the LoopNEST configuration 500 to connect the loops for 4-point Kelvin type measurements. The arrangement of loops shown in FIG. 12 can be used to explore the interaction distance inside a certain metal density area. Thus defect densities as well as defect size distributions can be determined along with the erosion and interaction distance evaluation using the same chip area.

Figure 13:
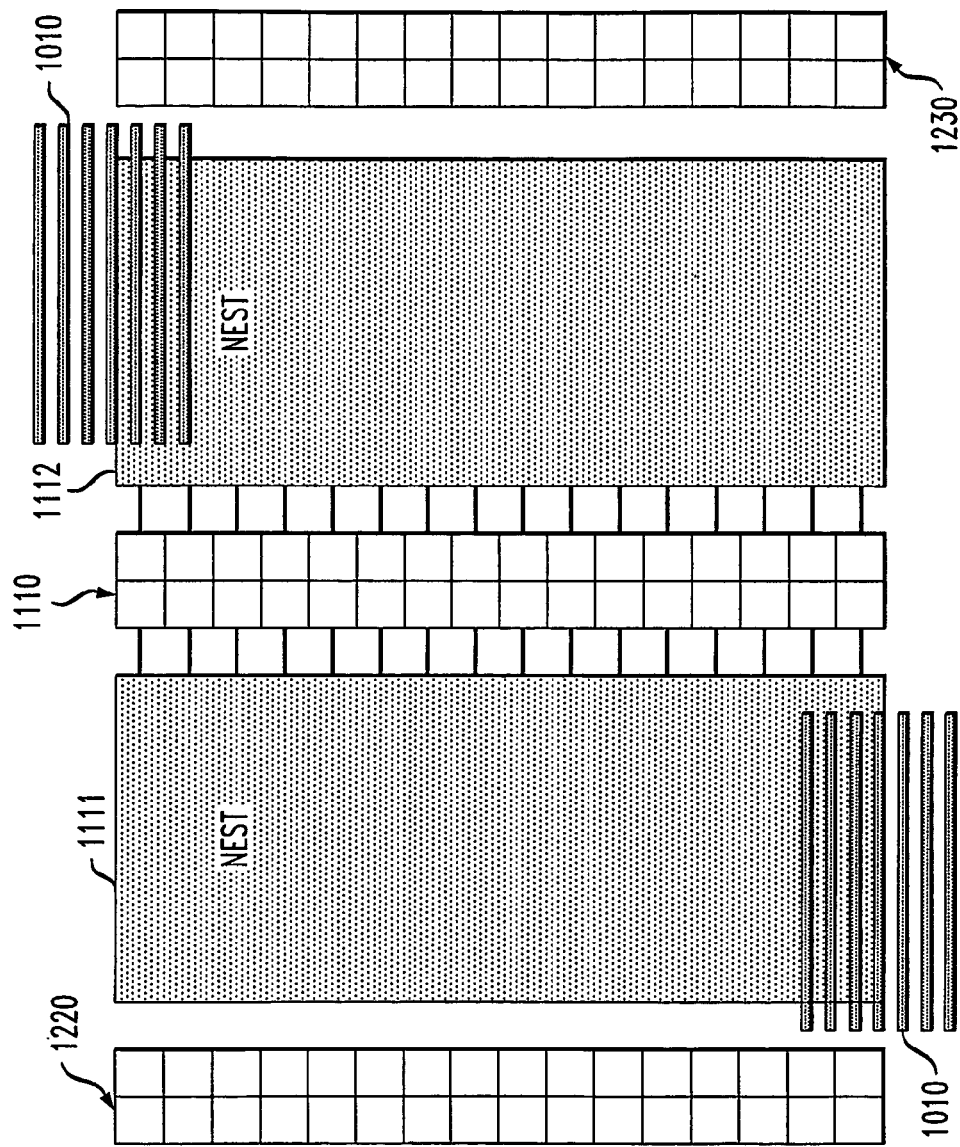
FIG. 13 shows a possible arrangement of loops within the LoopNEST structure to explore the interaction distance close to the boundary between two different metal density areas.

Reference is now made to FIG. 13. Besides exploring the interaction within the NEST structure, the area near the boundary between two different density areas can also be explored. The example of FIG. 13 shows a possible arrangement of loops within the LoopNEST structure to explore the interaction distance close to the boundary between two different metal density areas. In general, any kind of placement can be implemented for the loops.

Figure 14:
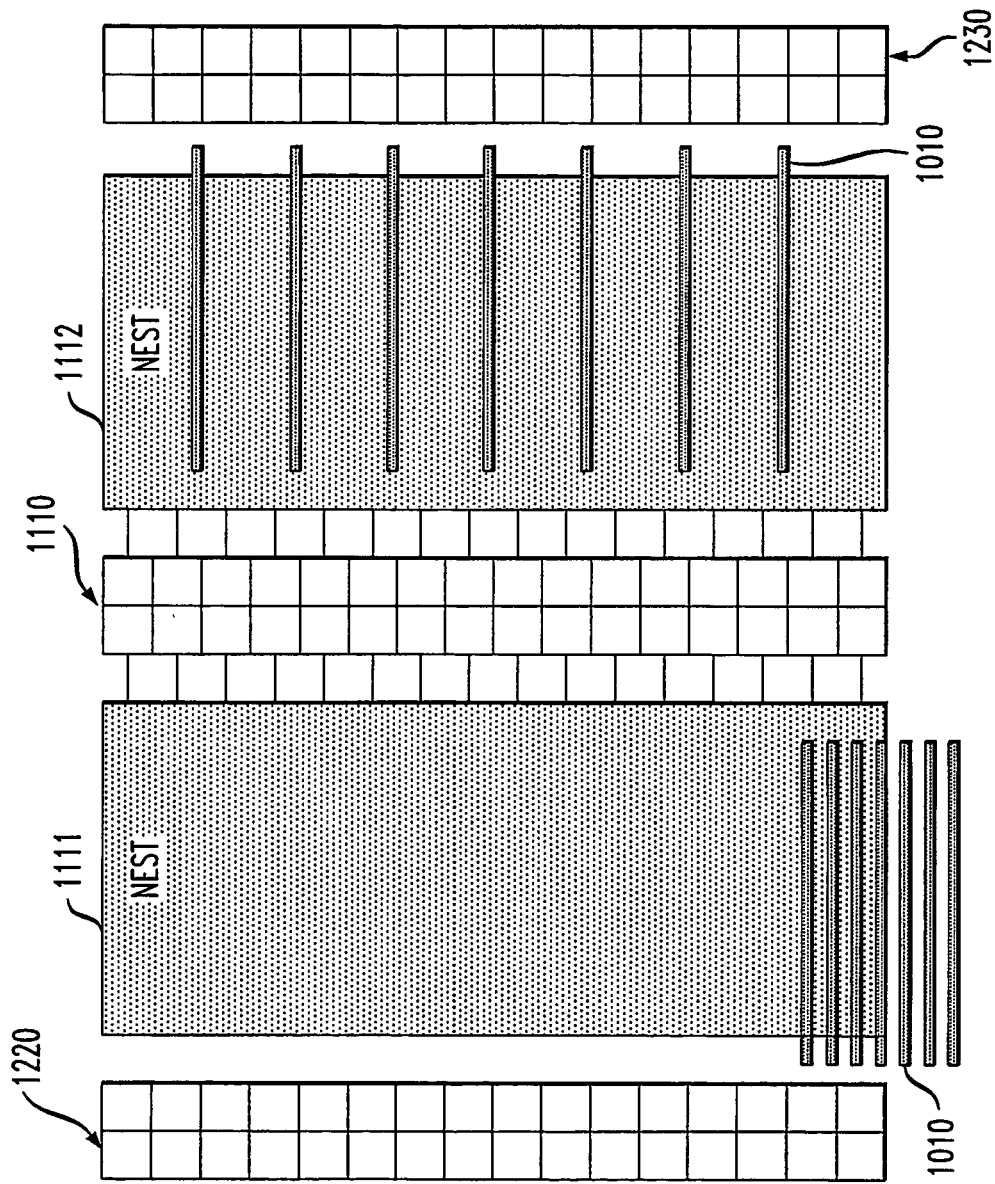
FIG. 14 shows that different loop arrangement styles can be implemented to explore different areas of interest.

Alternatively, different arrangements can be combined as shown in FIG. 14. FIG. 14 is an example of a way in which different loop arrangement styles can be implemented to explore different areas of interest.

For investigating erosion and its interaction distance the following guidelines should be applied regarding setting up a Design of Experiment (DOE):

1. Implement at least 2 nest densities:
   max density (min space, maximum line width)
   nominal density (nominal line, space)
2. Confirm interaction distance seen in maximum density LoopNEST and add other densities if there is space on mask
3. Isolate LoopNESTs with 200 micrometers of empty space on top and bottom.

Figure 15:
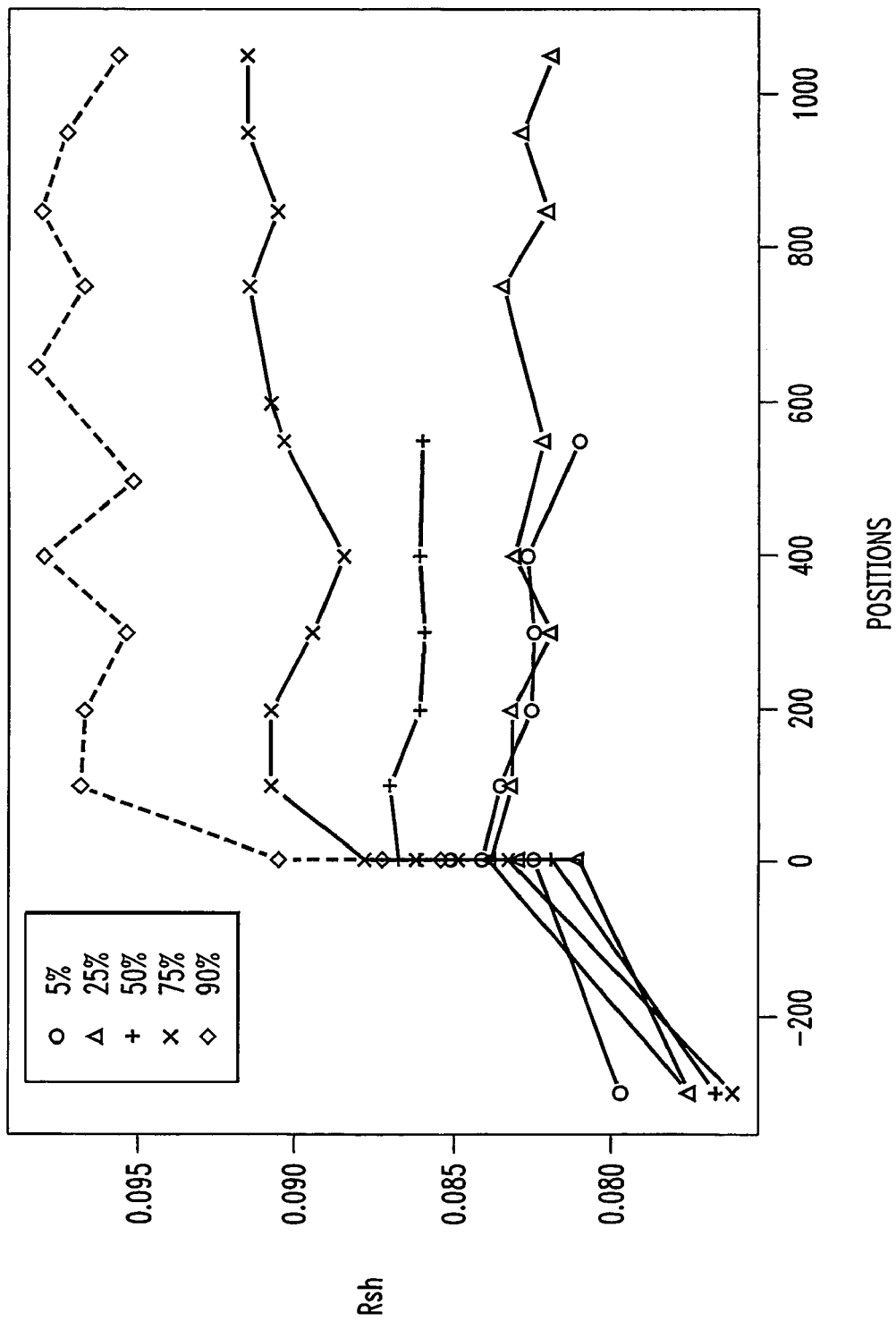
FIG. 15 is a graph showing experimental results from a LoopNEST structure.

To provide some exemplary experimental results, test vehicle structures with different densities (5%, 25%, 50%, 75% and 90%) can be designed to investigate the Cu lines dependency on their global neighborhood density. For each density there are Kelvin loops placed at different positions inside the global lines. The erosion interaction distance can be determined by analyzing the sheet resistances that are plotted at each density vs. the loop positions in the global neighborhood as shown for instance in FIG. 15.

Although an exemplary use for the test structures described herein is for analysis of Cu CMP dishing and erosion effects, one of ordinary skill can apply the test structures for analysis of structures formed from other metals besides copper.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A test structure having a first structure for erosion evaluation and a second structure for extraction of defect size distributions and defect density distributions.

2. The test structure of claim 1, wherein the second structure is a NEST structure.

3. The test structure of claim 2, wherein the first structure is a loop structure usable to determine a resistance value that varies with metal height.

4. The test structure of claim 3, wherein loop lines of the loop structure are connected on both sides of the NEST structure.

5. The test structure of claim 4, wherein the loop lines are located more closely together on one side of the NEST structure than on the other side of the NEST structure.

6. The test structure of claim 4, wherein the loop lines are positioned differently on one side of the NEST structure than on the other side of the NEST structure.

7. The test structure of claim 3, wherein the loop structure is suitable for making four-point Kelvin type measurements.

8. The test structure of claim 3, wherein the loop structure includes a plurality of snake segments, each snake segment having a respective tap.

9. The test structure of claim 8, wherein the loop structure further comprises a first plurality of patterns for evaluating interactions between the snake segments and a global neighborhood around the loop structure.

10. The test structure of claim 9, wherein the loop structure further comprises a first plurality of patterns for evaluating interactions between the snake segments and a local neighborhood around the loop structure.

11. The test structure of claim 3, wherein the loop structure is used to extract an interaction distance of pattern variations on a plurality of kelvin strip lines, the interaction distance being a distance between a first region in which the kelvin strip lines have a first constant height and a second region in which the kelvin strip lines have a second constant height different from the first constant height.

12. The test structure of claim 11, wherein the loop structure has a transition region having an interaction distance through which pattern height changes in a gradual manner from the first constant height of the first region to the second constant height of the second region.

13. The test structure of claim 1, wherein the second structure is a NEST structure comprising a plurality of pairs of lines on a single surface of a single layer of the substrate, each pair of lines having a shared pad therebetween.

14. The test structure of claim 13, wherein the lines of the NEST structure are nested serpentine lines, and none of the nested serpentine lines crosses any other one of the nested serpentine lines.

15. The test structure of claim 13, wherein the nested serpentine lines within each pair are not adjacent to each other.

16. The test structure of claim 13, wherein:
each pair of lines includes a respective first line and a respective second line;
each first line in the NEST structure has a respective position within a first sequence;
each second line in the NEST structure has a respective position within a second sequence different from the first sequence; and
within each pair of lines, the position of the second line within the second sequence is different from the position of the corresponding first line within the first sequence.

17. A method for analyzing a semiconductor process, comprising the steps of:
forming a test structure having a first structure and a second structure;
evaluating erosion based on measurements of the first structure; and
extracting defect size distributions and defect density distributions based on measurements of the second structure.

18. The method of claim 17, further comprising:
using a design of experiment to check global erosion effects, local dishing effects and interaction between dishing and erosion.

19. The method of claim 18, wherein the design of experiment includes varying a pattern density of a global region around the first structure to allow measurement of oxide erosion.

20. The method of claim 19, wherein the pattern density of the global region is varied without varying a line size of the first structure.

21. The method of claim 19, wherein a line size of the first structure varies and is kept substantially equal to a line size of the global region, to allow evaluation of the interaction between dishing and erosion.

22. The method of claim 18, wherein the design of experiment includes varying a line width of the first structure to allow measurement of metal dishing.

* * * * *